(12) United States Patent
Gosain et al.

(10) Patent No.: US 6,806,169 B2
(45) Date of Patent: *Oct. 19, 2004

(54) SEMICONDUCTOR DEVICE MANUFACTURING METHOD

(75) Inventors: Dharam Pal Gosain, Kanagawa (JP); Setsuo Usui, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,055

(22) Filed: Jul. 28, 1999

(65) Prior Publication Data

US 2002/0004289 A1 Jan. 10, 2002

(30) Foreign Application Priority Data

Aug. 4, 1998 (JP) .......................................... P10-220299

(51) Int. Cl.$^7$ ............................................... H01L 21/00
(52) U.S. Cl. ........................ 438/475; 438/514; 438/525
(58) Field of Search ................................. 438/475, 514, 438/525, 789, 471, 787, 790, 474, 473, 472, 470, 515, 526; 257/347, 348, 349, 350–355, 59, 66, 72, 291, 292

(56) References Cited

U.S. PATENT DOCUMENTS 4,737,379 A * 4/1988 Hudgens et al. ............... 427/39
5,304,509 A * 4/1994 Sopori .......................... 438/58
5,543,336 A * 8/1996 Enami et al. ................ 438/528
5,574,293 A * 11/1996 Arai et al. .................... 438/59
5,591,988 A * 1/1997 Arai et al. ..................... 257/66
5,620,906 A * 4/1997 Yamaguchi et al. ......... 438/162
5,633,174 A * 5/1997 Li ............................... 438/475
5,793,461 A * 8/1998 Inou ........................... 349/153
5,946,585 A * 8/1999 Zhang et al. ................ 438/475
6,019,796 A * 2/2000 Mei et al. .................... 938/151
6,028,015 A * 2/2000 Wang et al. ................. 438/789
6,099,918 A * 8/2000 Kawamura .................. 427/554
6,165,896 A * 12/2000 Schnabel et al. ............ 438/636
6,365,935 B1 * 4/2002 Zhang et al. ................ 257/347
6,483,172 B1 * 11/2002 Cote et al. ................... 257/639

FOREIGN PATENT DOCUMENTS

JP 08228010 A * 9/1996 .................. 29/786
JP 09205208 A * 8/1997 ......... H01L/29/786

* cited by examiner

*Primary Examiner*—Carl Whitehead, Jr.
*Assistant Examiner*—Laura M Schillinger
(74) *Attorney, Agent, or Firm*—Sonnenschein, Nath & Rosenthal LLP (57) ABSTRACT

In a manufacturing method of a thin-film transistor having a polycrystalline Si film as its active region, an amorphous-phase Si film is first formed, and pulse laser beams are irradiated to crystallize the Si film and thereby form a polycrystalline Si film. After electrodes are made on a source region and a drain region, a $SiN_x$ film as a hydrogen-containing film is formed on the entire surface. By irradiating pulse laser beams to heat the $SiN_x$ film, hydrogen in the $SiN_x$ film is diffused into the polycrystalline Si film to hydrogenate it and reduce the trap density along crystal grain boundaries in the polycrystalline Si film.

10 Claims, 7 Drawing Sheets

NUMBER OF IRRADIATION PULSES

Fig. 9

GATE VOLTAGE (V)

SEMICONDUCTOR DEVICE MANUFACTURING METHOD

RELATED APPLICATION DATA

The present application claims priority to Japanese Application No. P10-220299 filed Aug. 4, 1998, which application is incorporated herein by reference to the extent permitted by law.

BACKGROUND OF THE INVENTION

1. Field of the Invention

This invention relates to a semiconductor device manufacturing method particularly suitable for use in fabrication of a thin-film transistor.

2. Description of the Related Arts

In a typical thin-film transistor (TFT), its active region is made of a polycrystalline silicon (Si) film, for example. When manufacturing a thin-film transistor of this type, the polycrystalline Si film is usually hydrogenated to decrease the trap density of crystal grain boundaries of the polycrystalline Si film forming the active region and thereby to improve the performance characteristics of the film transistor. Heretofore, the hydrogenation of the polycrystalline Si film has been done by first making a hydrogen-containing film, such as silicon nitride ($SiN_x$) film containing hydrogen, on a polycrystalline Si film, and then annealing the substrate at a temperature higher than approximately 300° C.

On the other hand, plastic substrates of polyether sulfone (PES) and polyethylene terephthalate (PET) have recently become to be used as substrates of thin-film transistors.

However, heat-resistant temperature of plastic substrates of polyether sulfone is about 200° C., and heat-resistant temperature of plastic substrates of polyethylene terephthalate is about 100° C. Both are lower than heat-resistant temperatures of glass substrates, and they involved the following problem.

That is, for hydrogenation of the polycrystalline Si film, the conventional technology had to heat the substrate to 300° C. or higher. When the substrate is a glass substrate, the process is done well. However, when using a plastic substrate of PES or PET having a low heat resistance as explained above, the substrate cannot resist the process temperature. Therefore, processes for manufacturing thin-film transistors need a technique capable of hydrogenating the polycrystalline Si film at a temperature not higher than heat-resistant temperatures of plastic substrates.

SUMMARY OF THE INVENTION

It is therefore an object of the invention to provide a manufacturing method of a semiconductor device capable of hydrogenating a semiconductor film without damaging its substrate even when the substrate is of a kind having a low heat resistance like a plastic substrate.

According to the invention, there is provided a semiconductor device manufacturing method comprising the steps of:

forming a semiconductor film on a substrate;

forming a hydrogen-containing film on the semiconductor film; and irradiating a pulse energy beam to heat the hydrogen-containing film and thereby diffuse hydrogen in the hydrogen-containing film into the semiconductor layer.

In the present invention, a low heat-resistant substrate having a heat-resistant temperature of 300° C. or lower, for example can be used as the substrate. Examples of the substrate of this type are plastic substrates of polyether sulfone whose heat-resistant temperature is approximately 200° C., plastic substrates of polyethylene terephthalate whose heat resistant temperature is approximately 100° C. Further examples are plastic substrates of polymethyl methacrylate (PMMA) and plastic substrates of polycarbonate (PC). Typically used as the semiconductor film is a polycrystalline semiconductor film or a non-single-crystalline semiconductor films such as amorphous semiconductor film. However, a single-crystalline semiconductor film is also usable. More particularly, a polycrystalline silicon film, amorphous silicon film or single-crystalline silicon film, for example, is used as the semiconductor film. Typically used as the hydrogen-containing film is an insulating film containing hydrogen. However, a semiconductor film containing hydrogen is also usable. More particularly, a silicon nitride film or an amorphous silicon film containing hydrogen, for example, is used as the hydrogen-containing film. The pulse energy beam is irradiated from the side of the hydrogen-containing film onto the substrate having formed the hydrogen-containing film.

In the present invention, laser beams are typically used as the pulse energy beams. Other than laser beams, electron beams and ion beams are also usable as the pulse energy beams. The pulse energy beam is irradiated from the side of the hydrogen-containing film, for example, to the substrate having formed the hydrogen-containing film. In this invention, the pulse energy beams preferably have a wavelength absorbed by the hydrogen-containing film to ensure the hydrogen-containing film be effectively heated by irradiation of the pulse energy beams. If the pulse energy beams are not absorbed by the hydrogen-containing film but are absorbed by the underlying semiconductor film, heating of the semiconductor film results in heating the hydrogen-containing film. Therefore, such pulse energy beams can be used as well. Energy density, number of pulses and width of a pulse of the pulse energy beams are preferably determined not to melt the semiconductor film. Alternatively, the semiconductor film may be crystallized and re-crystallized by irradiating other pulse energy beam to the semiconductor film after making the semiconductor film on the substrate and before making the hydrogen-containing film on the semiconductor film. In this case, for example, energy density of the pulse energy beams used for heating the hydrogen-containing film is determined to be lower than the energy density of the other pulse energy beams used to crystallize or re-crystallize the semiconductor film.

According to the invention having the above-summarized construction, since the semiconductor film can be hydrogenated by irradiating the pulse energy beam, thereby heating the hydrogen-containing film, thereby diffusing hydrogen in the hydrogen-containing film into the semiconductor film and thereby selectively heating the hydrogen-containing film, the semiconductor film can be hydrogenated without damaging the substrate even when the substrate is a low heat-resistant substrate like a plastic substrate.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are explained below with reference to the drawings.

First explained is the first embodiment of the invention. Explanation made here is directed to fabrication of a bottom-gate-type thin-film transistor in which its active region is a polycrystalline Si film. FIGS. 1 through 5 are cross-sectional views for explaining a thin-film transistor manufacturing method according to the first embodiment.

Figure 1:
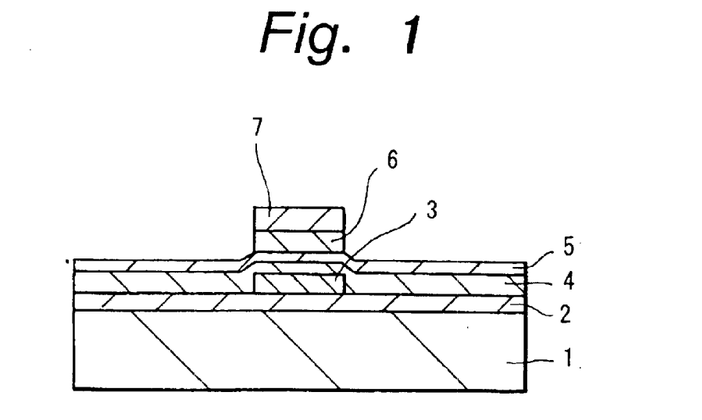
FIG. 1 is a cross-sectional view for explaining a thin-film transistor manufacturing method according to the first embodiment of the invention.

In the thin-film transistor manufacturing method according to the first embodiment, as shown in FIG. 1, a protective film 2 such as silicon dioxide ($SiO_2$) film on a plastic substrate 1 made of, for example, polyether sulfone (PES) whose heat-resistance temperature is about 200° C., by low-temperature plasma chemical vapor deposition (CVD), for example. After an Al film, for example, is next formed on the entire surface, the Al film is patterned into a predetermined configuration to make a gate electrode 3. Ta or Mo, for example, is also usable instead of Al as the material of the gate electrode 3.

After that, a gate insulating film 4 of approximately 150 nm thick $SiO_2$, for example, an amorphous Si film 5 of a thickness around 30 nm, for example, and a $SiO_2$ film 6 of a thickness from 50 to 100 nm for example, are formed sequentially by sputtering, for example, on the entire surface so as to cover the gate electrode. In an example of sputtering conditions of these gate insulating film 4, Si film 5 and $SiO_2$ film 6, when making the gate insulating film 4, the target is Si, process gas is a mixed gas of helium (He) and oxygen ($O_2$), flow rates of He gas and $O_2$ gas are 50 sccm and 5 sccm, and the electric discharge power is 150 W. When making the Si film 5, Si is used as the target, He gas is used as the process gas, flow rate of the He gas is 50 sccm, its pressure is 5 mTorr, and the electric discharge power is 150 W. When making the $SiO_2$ film 6, Si is used as the target, a mixed gas of He and $O_2$ is used as the process gas, flow rates of He gas and $O_2$ gas are 50 sccm and 5 sccm, and the electric discharge power is 100 W.

After that, a resist pattern 7 having substantially the same shape as that of the gate electrode 3 is formed on a part of the $SiO_2$ film 6 above the gate electrode 3. Using this resist pattern 7 as a mask, the $SiO_2$ film 6 is patterned by etching. As a result, the $SiO_2$ film 6 with substantially the same configuration as the gate electrode 3 is formed above the gate electrode 3 via the gate insulating film 4 and the Si film 5.

Figure 2:
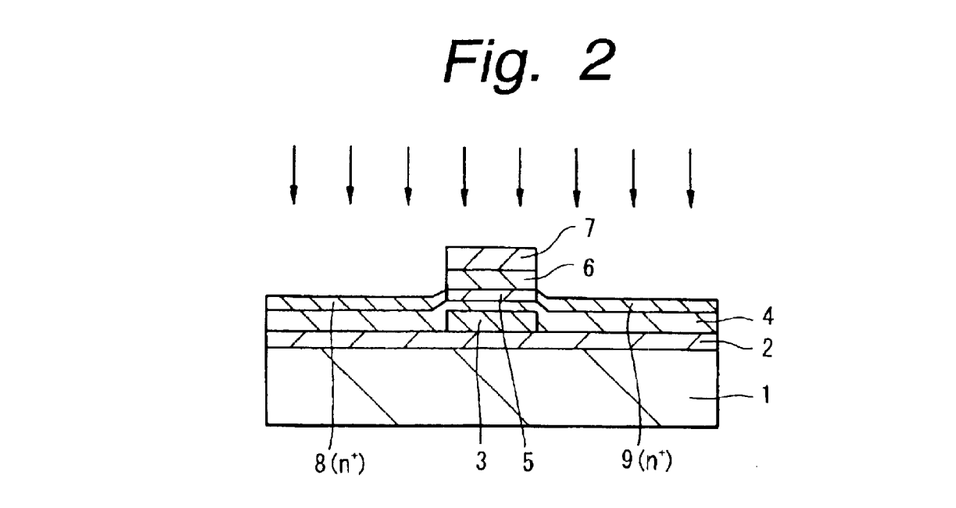
FIG. 2 is a cross-sectional view for explaining the thin-film transistor manufacturing method according to the first embodiment of the invention.

Thereafter, as shown in FIG. 2, while keeping the resist pattern 7 on the $SiO_2$ film 6, using these resist pattern 7 and $SiO_2$ film 6 as a mask, an n-type impurity, such as P, is selectively doped into the Si film 5 by plasma doping, for example. As a result, n$^+$-type source region 8 and drain region 9 are formed in the Si film 5 in self alignment with the $SiO_2$ film 6, that is, in self alignment with the gate electrode 3.

Figure 3:
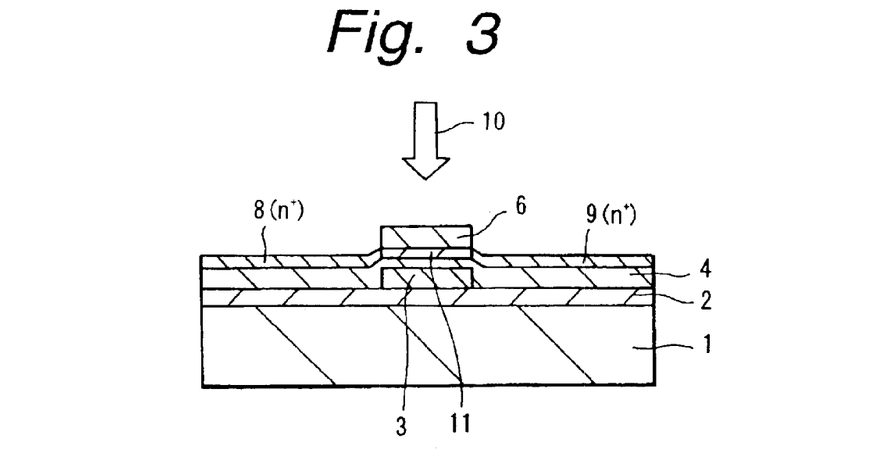
FIG. 3 is a cross-sectional view for explaining the thin-film transistor manufacturing method according to the first embodiment of the invention.

Then, after the resist pattern 7 is removed, pulse laser beams 10 are irradiated to the substrate from the side of the Si film 5 to anneal the Si film 5. As a result of laser annealing using the pulse laser beams 10, the amorphous-state Si film 5 is crystallized. FIG. 3 shows the aspect after crystallization of the amorphous Si film 5, and reference numeral 11 denotes a polycrystalline film as a result of the crystallization. The polycrystalline Si film 11 forms the active region of the thin-film transistor. In this case, an appropriate kind of the pulse laser beams 10 and a thickness of the Si film 5 are preferably chosen to ensure the Si film 5 be selectively heated by the pulse laser beams 10. Irradiation energy density of the pulse laser beams 10 is chosen to a value to ensure, for example, that the Si film does not melt substantially but annealing be effective. Concretely, a XeCl excimer laser of the wavelength 308 nm, for example, is used as the light source for the laser annealing. When the Si film is 30 nm thick, irradiation energy density of the pulse laser beam 10 is set to 200 mJ/cm$^2$, pulse width to 30 ns, and number of irradiation pulses to 1000 pulses, for the laser annealing.

Figure 4:
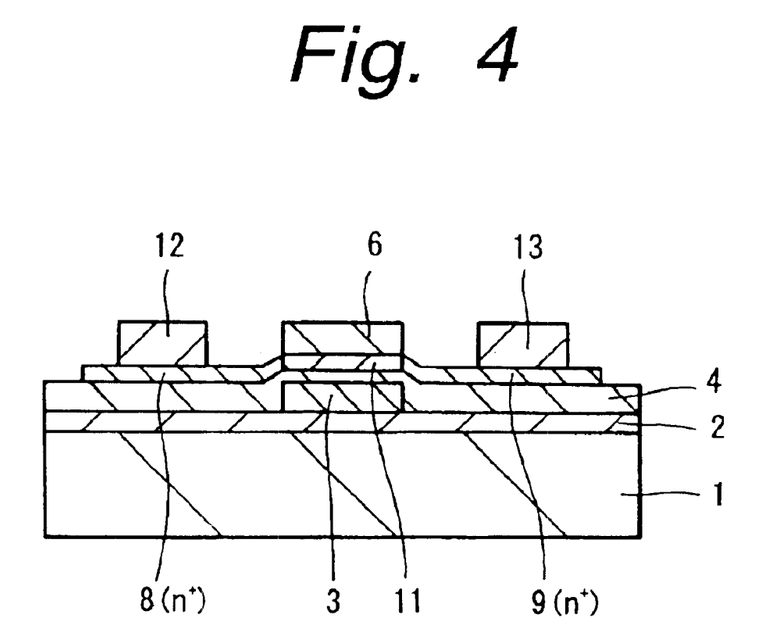
FIG. 4 is a cross-sectional view for explaining the thin-film transistor manufacturing method according to the first embodiment of the invention.

Next as shown in FIG. 4, the polycrystalline Si film 11 is patterned into a predetermined configuration by etching to isolate each location for each thin-film transistor.

Subsequently, electrodes 12 and 13 made of Al, for example, are made on locations of the polycrystalline Si film 11 corresponding to the source region 8 and the drain region 9 by sputtering and lift-off, for example.

Figure 5:
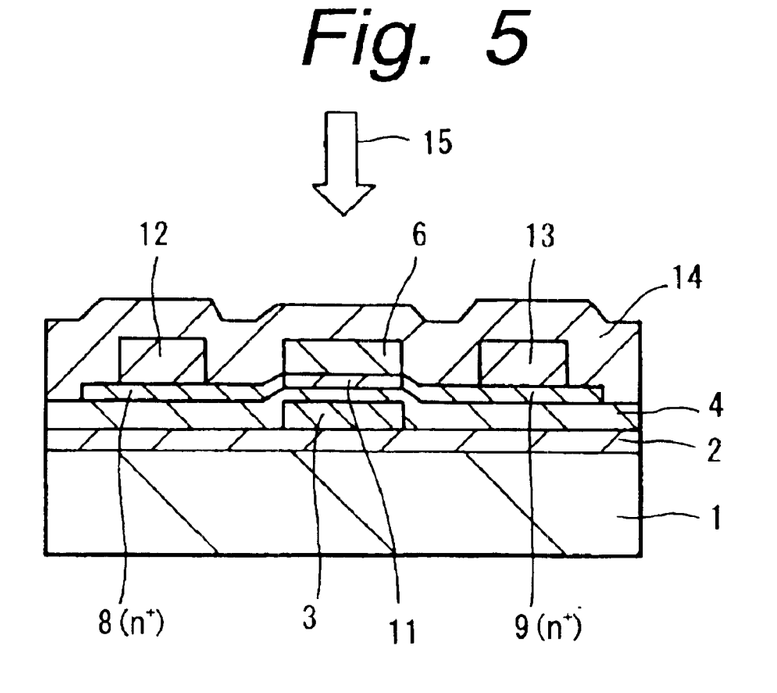
FIG. 5 is a cross-sectional view for explaining the thin-film transistor manufacturing method according to the first embodiment of the invention.

Next as shown in FIG. 5, a 100 nm thick silicon nitride (SiN$_x$) film 14 is formed on the entire surface by low-temperature plasma CVD, for example. In an example of conditions for making the SiN$_x$ film 14, a mixed gas of SiH$_4$, NH$_3$ and N$_2$ is used as the process gas, flow rate of SiH$_4$ gas is 10 sccm, flow rate of NH$_3$ is 40 sccm, flow rate of N$_2$ is 135 sccm, pressure is 100 mTorr, and plasma power is 40 W. The SiN$_x$ film 14 contains hydrogen therein, and behaves as a hydrogen supply source during hydrogenation of the polycrystalline Si film 11 explained later.

Thereafter, pulse laser beams 15 are irradiated onto the substrate from the side of the SiN$_x$ film 14 as the hydrogen-containing film to heat the SiN$_x$ film 14, thereby diffusing hydrogen from the SiN$_x$ film 14 into the polycrystalline Si film 11 to hydrogenate it, and hence inactivating dangling bonds along crystal grain boundaries of the polycrystalline Si film 11 to decrease the trap density. At the same time, the electrodes 12 and 13 connected to the source region 8 and the drain region 9 are sintered, and their ohmic characteristics are improved.

In this case, the pulse laser beams 15 preferably have a wavelength absorbed by the SiN$_x$ film 14 to ensure the SiN$_x$ film 14 be effectively heated by irradiation of the pulse laser beams 15. Even when the pulse laser beams 15 are not absorbed by the SiN$_x$ film 14, they can be used similarly as far as they are absorbed by the underlying polycrystalline Si film 11 and can indirectly heat the SiN$_x$ film 14. However, if the pulse laser beam 15 are infrared light, the electrodes 12, 13, plastic substrate 1, and so forth, below the SiN$_x$ film 14 are heated, and their temperatures will increase. Therefore, those with relatively shorter wavelengths are appropriate as the pulse laser beams 15.

Irradiation energy density, pulse width, and number of irradiation pulses of the pulse laser beams 15 are chosen to values ensuring the polycrystalline Si film 11 does not melt substantially and the SiN$_x$ film 15 be heated effectively, for example. Additionally, irradiation energy density of the pulse laser beams 15 is chosen to be lower than the irradiation energy density of the pulse laser beams 10 used for making the polycrystalline Si film 11 by crystallizing the amorphous Si film 5 as explained above. In this case, for example, a XeCl excimer laser of the wavelength 308 nm is used as the light source of the pulse laser beams 15; the irradiation energy density of the pulse laser beams 15 is chosen to be not lower than 40 mJ/cm$^2$ and not higher than 200 mJ/cm$^2$, preferably not lower than 60 mJ/cm$^2$ and not higher than 140 mJ/cm$^2$, such as 100 mJ/cm$^2$, for example; and the pulse width to be 30 nm, number of irradiation pulses to be from 1 pulse to 104 pulses, preferably from 1 pulse to 103, such as 400 pulses. Temperature of the plastic substrate 1 during hydrogenation is approximately the room temperature.

Through the steps explained above, the bottom-gate-type thin-film transistor including the polycrystalline Si film as its active region is completed. All of the above-explained processes in the first embodiment are executed at temperatures not higher than the heat-resistant temperature of the plastic substrate 1.

To experimentally confirm the effect of reducing the trap density of crystal grain boundaries in the polycrystalline Si film 11 as a result of hydrogenation by irradiating the pulse laser beams 15 and thereby diffusing hydrogen from the SiN$_x$ film 14 into the polycrystalline Si film 11, the Inventor prepared samples of the thin-film transistor by the thin-film transistor manufacturing method according to the first embodiment by changing the irradiation energy density and the number of irradiation pulses of the pulse laser beams 15, and measured gate voltage to drain current characteristics on these samples different in irradiation energy density and number of irradiation pulses.

Samples prepared without irradiation of the pulse laser beams 15 did not attain good gate voltage to drain current characteristics because the trap density of crystal grain boundaries in the polycrystalline Si film 11 was high and channels were not readily made even by application of a gate voltage. In contrast, as the irradiation energy density was increased step by step from 40 mJ/cm$^2$ while fixing the number of irradiation pulses of the pulse laser beams 15 to 100 pulses, a change was observed in the gate voltage to drain current characteristics when the irradiation energy density was increased to 80 mJ/cm$^2$.

Figure 6:
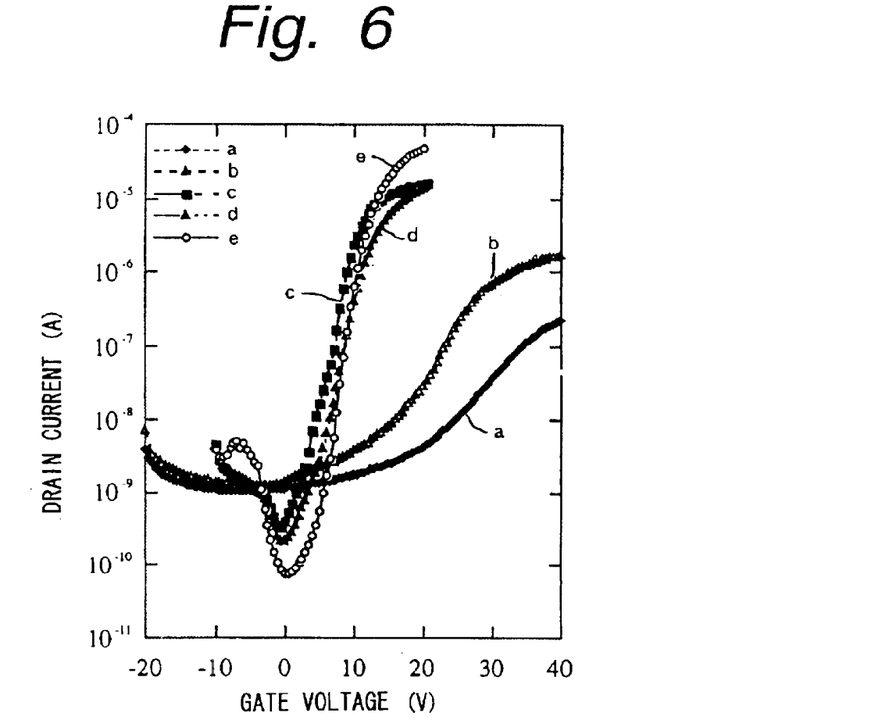
FIG. 6 is a graph showing dependency of gate-voltage to drain current characteristics of samples upon irradiation energy density and number of irradiation pulses of pulse laser beams, with the samples being prepared by the thin-film transistor manufacturing method according to the first embodiment.

FIG. 6 is a graph showing dependency of the gate voltage to drain current characteristics of samples prepared by the thin-film transistor manufacturing method according to the first embodiment upon the irradiation energy density of the pulse laser beams 15 and the number of irradiation pulses. In FIG. 6, the abscissa shows the gate voltage (V); the ordinate shows the drain current (A); a graph a shows gate voltage to drain current characteristics of samples obtained by irradiation energy density being 80 mJ/cm$^2$ and number of irradiation pulses being 100 pulses; a graph b shows those of samples obtained by irradiation energy density being 90 mJ/cm$^2$ and number of irradiation pulses being 100 pulses; a graph c shows those of samples obtained by the irradiation energy density being 90 mJ/cm$^2$ and number of irradiation pulses being 500 pulses; a graph d shows those of samples obtained by the irradiation energy density being 100 mJ/cm$^2$ and number of irradiation pulses being 100 pulses; and a graph d shows those of samples obtained by the irradiation energy density being 100 mJ/cm$^2$ and number of irradiation pulses being 500 pulses.

It is known from FIG. 6 that, when the number of irradiation pulses of the pulse laser beams is 100 pulses, the gate voltage to drain current characteristics are improved as the irradiation energy density increases from 80 mJ/cm$^2$ (graph a) to 90 mJ/cm$^2$ (graph b) further to 100 mJ/cm$^2$ (graph d). It is also known from FIG. 6 that, when the irradiation energy density is 90 mJ/cm$^2$, the gate voltage to drain current characteristics are further improved by increasing the number of irradiation pulses from 100 pulses (graph b) to 500 pulses (graph c), and also when the irradiation energy density is 100 mJ/cm$^2$, the gate voltage to drain current characteristics are improved similarly by increasing the number of irradiation pulses from 100 pulses (graph d) to 500 pulses (graph 3).

Figure 7:
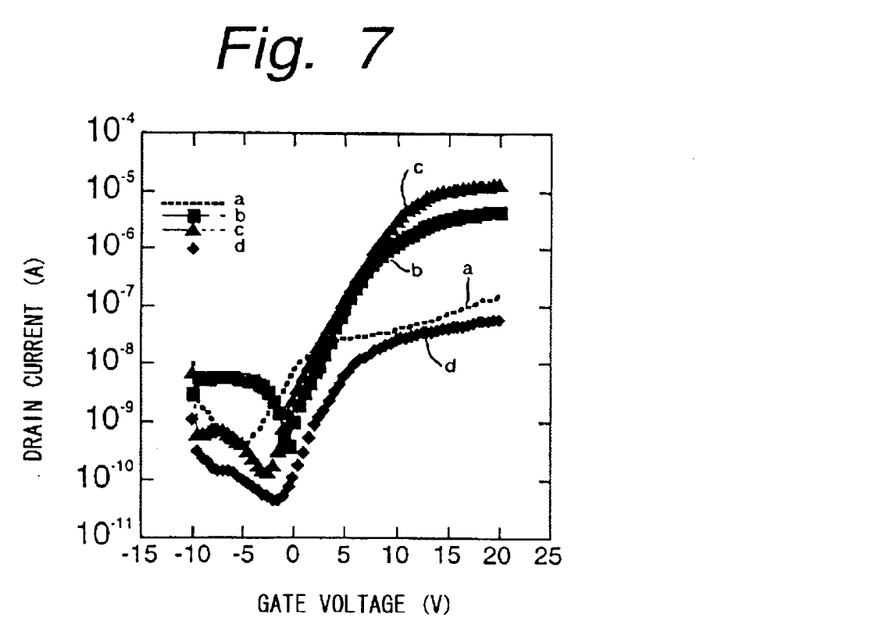
FIG. 7 is a graph showing dependency of gate-voltage to drain current characteristics of samples upon the number of irradiation pulses of pulse laser beams, with the samples being prepared by the thin-film transistor manufacturing method according to the first embodiment under the irradiation energy density of the pulse energy beams, 100 mJ/cm$^2$.
Figure 8:
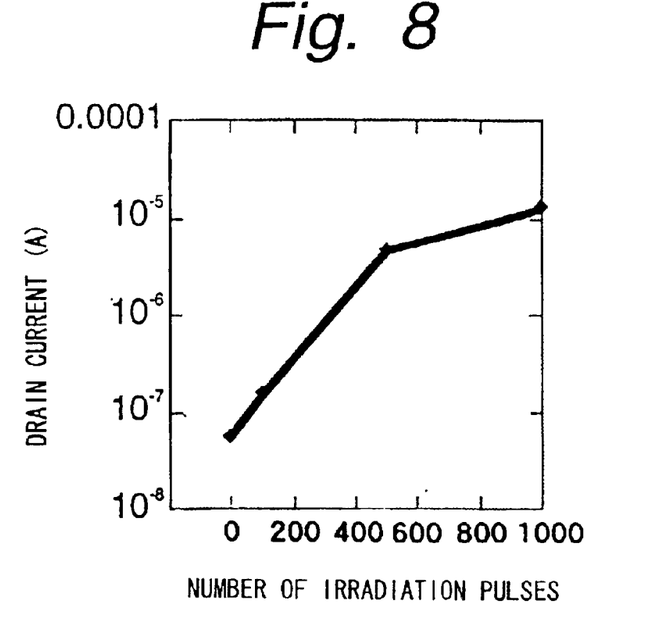
FIG. 8 is a graph showing a relation between the number of irradiation pulses of the pulse laser beams obtained from FIG. 7 and the drain current under the gate voltage of 20 V.

FIG. 7 is a graph showing dependency of the gate voltage to drain current characteristics of samples prepared by the thin-film transistor manufacturing method according to the first embodiment setting the irradiation energy density of the pulse laser beams 15 to 100 mJ/cm$^2$ upon the number of irradiation pulses. In FIG. 7, the abscissa shows the gate voltage (V); the ordinate shows the drain current (A); a graph a shows gate voltage to drain current characteristics of samples obtained by setting the number of irradiation pulses to 100 pulses, a graph b shows those of samples obtained by setting the number of irradiation pulses to 500 pulses, and a graph c shows those of samples obtained by setting the number irradiation pulses to 1000. For comparison purposes, FIG. 7 also shows gate voltage to drain current characteristics of samples prepared without irradiating pulse laser beams 15 as a graph d. FIG. 8 is a graph showing a relation between the numbers of irradiation pulses of the pulse laser beams 15 obtained from FIG. 7 and the drain current upon the gate voltage being 20 V. In FIG. 8, the abscissa shows number of irradiation pulses, and the ordinate shows values of the drain current (A) upon the gate voltage being 20 V.

It is apparent from FIGS. 7 and 8 that the drain current increases as the number irradiation pulses of the pulse laser beams 15 increases. When the pulse laser beams 15 are irradiated by approximately 1000 pulses, equivalent or higher characteristics are obtained as compared with ordinary thin-film transistors, namely, those made by using a glass substrate as the substrate and annealing the polycrystalline Si film forming the active region at 300° C. or a higher temperature to hydrogenate it. Therefore, even when the irradiation energy density is 40 mJ/cm$^2$, for example, satisfactory characteristics will be obtained by increasing the number of irradiation pulses.

Figure 9:
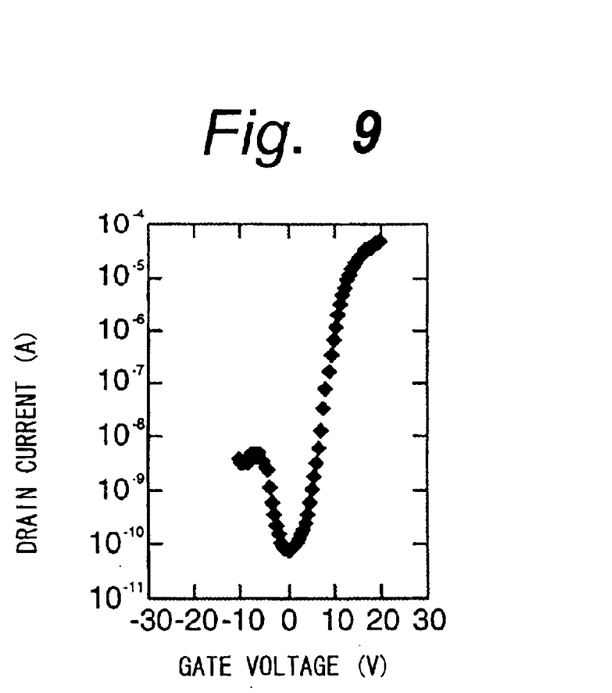
FIG. 9 is a graph showing relations between the gate voltage and the drain current of samples prepared by the thin-film transistor manufacturing method according to the first embodiment by increasing the irradiation energy density of the pulse laser beams from 40 mJ/cm$^2$ to 100 mJ/cm$^2$ by steps of 10 mJ/cm$^2$ and by fixing the number of pulses to 100 pulses for each irradiation density.

FIG. 9 is a graph showing relations between the gate voltage and the drain current of samples prepared by the thin-film transistor manufacturing method according to the first embodiment by increasing the irradiation energy density of the pulse laser beams from 40 mJ/cm$^2$ to 100 mJ/cm$^2$ by steps of 10 mJ/cm$^2$ and by fixing the number of pulses to 100 pulses for each irradiation density. In FIG. 9, the abscissa shows the gate voltage (V) and the ordinate shows the drain current (A). As shown in FIG. 9, very good characteristics were obtained with samples prepared by irradiating by 100 pulses of pulse laser beams 15 with any of irradiation energy densities of 40 mJ/cm$^2$, 50 mJ/cm$^2$, 60 mJ/cm$^2$, 70 mJ/cm$^2$, 80 mJ/cm$^2$, 90 mJ/cm$^2$ and 100 mJ/cm$^2$.

As explained above, by increasing the irradiation energy density and the number of irradiation pulses of the pulse laser beams 15 used for hydrogenating the polycrystalline Si film, it resulted in improving the gate voltage to drain current characteristics of the thin-film transistor. This is a result of promoted hydrogenation of the polycrystalline Si film 11 along with the increase of the irradiation energy density and the number of irradiation pulses of the pulse laser beams 15, which resulted in effectively reducing the trap density of crystal grain boundaries in the polycrystalline Si film 11. Thus, it has been confirmed that, by irradiating the pulse laser beams 15 and thereby selectively heating the SiN$_x$ film 14, the polycrystalline Si film 11 can be hydrogenated under a temperature not higher than the heat-resistant temperature of the plastic substrate 1.

As explained above, according to the first embodiment, in the thin-film transistor manufacturing process using the plastic substrate 1, since the SiN$_x$ 14 as the hydrogen-containing layer is heated by irradiating the pulse laser beams 15 to diffuse hydrogen from the SiN$_x$ film 14 into the polycrystalline Si film 11 forming the active region of the thin-film transistor, the SiN$_x$ film 14 can be heated selectively. Therefore, even when the plastic substrate has a low heat resistance (in this case, its heat-resistant temperature is around 200° C.), hydrogenation of the polycrystalline Si film 11 can be executed at a temperature not hither than the heat-resistant temperature of the plastic substrate 1, and the plastic substrate 1 can be protected from damage.

Additionally, by hydrogenation of the polycrystalline Si film 11, the trap density of crystal grain boundaries in the polycrystalline Si film 11 can be reduced effectively, and this promises fabrication of a thin-film transistor with good operating characteristics. In this case, furthermore, since the polycrystalline Si film 11 is hydrogenated by first making the electrodes 12, 13 on the polycrystalline Si film 11, then forming the SiN$_x$ film 14 thereon as the hydrogen-containing film, and thereafter irradiating the pulse laser beams 15 to heat the SiN$_x$ film 14, ohmic characteristics of the electrodes 12 and 13 can be improved simultaneously with the decrease of the trap density of crystal grain boundaries in the polycrystalline Si film 11.

Consequently, since the first embodiment holds temperatures not higher than 200° C., which is the heat-resistant temperature of the plastic substrate 1, throughout all of the processes including hydrogenation of the polycrystalline Si film 11, the plastic substrate 1 is never damaged in any of the processes.

Figure 10:
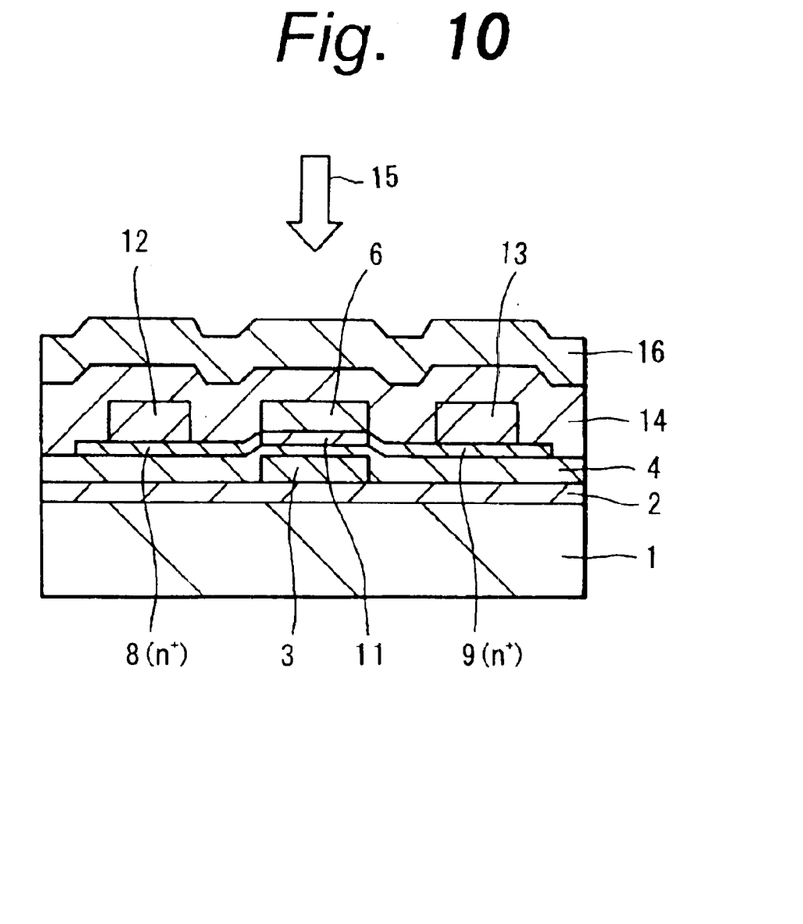
FIG. 10 is a cross-sectional view for explaining a thin-film transistor manufacturing method according to the second embodiment of the invention.

Next explained is the second embodiment of the invention. FIG. 10 is a cross-sectional view for explaining a thin-film transistor manufacturing method according to the second embodiment. In FIG. 10, parts or elements the same as or equivalent to those of the first embodiment are labeled with common reference numerals.

In the thin-film transistor manufacturing method according to the second embodiment, the process progresses in the same flow as the first embodiment explained above up to the step shown in FIG. 5 where the SiN$_x$ film 14 is formed as the hydrogen-containing film.

After that, as shown in FIG. 10, a metal film 16 of molybdenum (Mo), for example, is formed on the SiN$_x$ film 14. Other than Mo, tantalum (Ta) or tungsten (W) can be used as material of the metal film 16. After that, in the same manner as the first embodiment, for example, the pulse laser beams 15 are irradiated onto the substrate from the side of the metal film 16. In this case, the pulse laser beams 15 are absorbed by the metal film 16, and because of the metal film 16 being heated, the underlying SiN$_x$ film 14 is heated. As a result, in the same manner as the first embodiment, hydrogen in the SiN$_x$ film 14 is diffused into the polycrystalline Si film 11 to hydrogenate it, and dangling bonds along crystal grain boundaries in the polycrystalline Si film 11 are inactivated to thereby decrease the trap density. Thereafter, the metal film 16 is removed.

In the other respects, the thin-film transistor manufacturing method according to the second embodiment is the same as that according to the first embodiment. So, its explanation is omitted here.

The second embodiment also attains the same effects as those of the first embodiment. Additionally, in case of the second embodiment, since the pulse laser beams 15 are absorbed by the metal film 16, films under the metal film 16 can be protected from irradiation of the pulse laser beams 15.

Next explained is the third embodiment of the invention. Explanation is made here as manufacturing a top-gate type thin film transistor including a polycrystalline Si film as its active region. FIGS. 11 through 16 are cross-sectional views for explaining the thin-film transistor manufacturing method according to the third embodiment.

Figure 11:
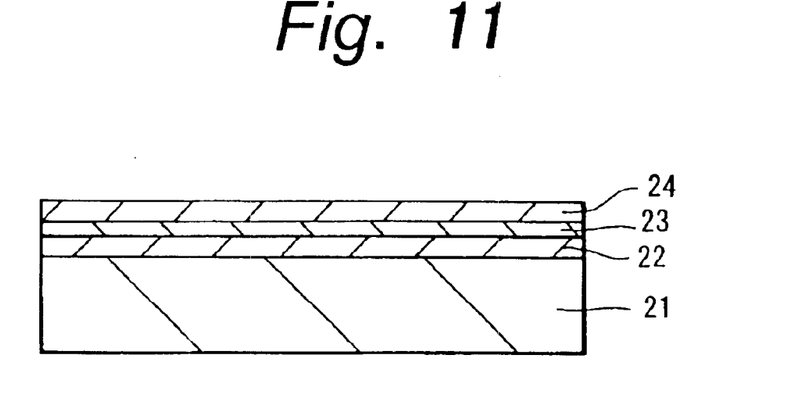
FIG. 11 is a cross-sectional view for explaining a thin-film transistor manufacturing method according to the third embodiment of the invention.

In the thin-film transistor manufacturing method according to the third embodiment, as shown in FIG. 11, a protective film 22 such as SiO$_2$ film on a plastic substrate 1 made of, for example, polyether sulfone whose heat-resistance temperature is about 200° C., by low-temperature plasma CVD, for example. After that, an amorphous-phase Si film 23, approximately 30 nm thick, for example, and a gate insulating film 24 of approximately 100 nm thick SiO$_2$ are formed on the entire surface of the protective film 22 by sputtering, for example. In an example of sputtering conditions of these Si film 23 and gate insulating film 24, when making the Si film 23, Si is used as the target, He gas is used as the process gas, flow rate of the He gas is 50 sccm, its pressure is 5 mTorr, and the electric discharge power is 150 W. When making the gate insulating film 24, Si is used as the target, a mixed gas of He and $O_2$ is used as the process gas, flow rates of He gas and $O_2$ gas are 50 sccm and 5 sccm, and the electric discharge power is 150 W.

Figure 12:
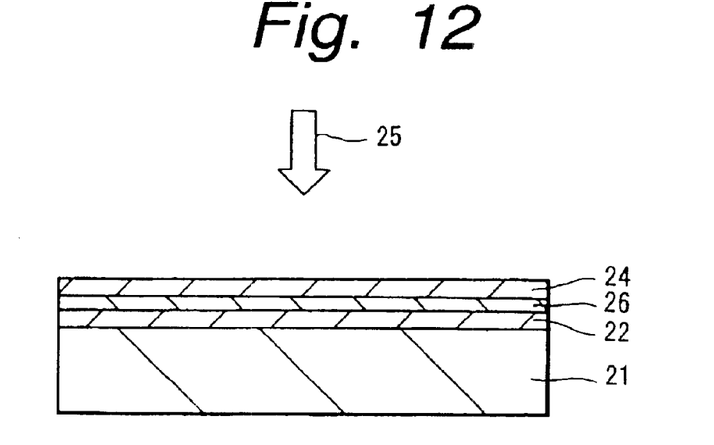
FIG. 12 is a cross-sectional view for explaining the thin-film transistor manufacturing method according to the third embodiment of the invention.

Then, as shown in FIG. 12, pulse laser beams 25 are irradiated to the substrate from the side of the Si film 23 to anneal the Si film 23. As a result of laser annealing using the pulse laser beams 25, the amorphous-phase Si film 23 is crystallized. FIG. 12 shows the aspect after crystallization of the amorphous Si film 23, and reference numeral 26 denotes a polycrystalline film as a result of the crystallization. The polycrystalline Si film 26 forms the active region of the thin-film transistor. In this case, an appropriate kind of the pulse laser beams 25 and a thickness of the Si film 23 are preferably chosen to ensure the Si film 23 be selectively heated by the pulse laser beams 25. Irradiation energy density of the pulse laser beams 25 is chosen to a value to ensure, for example, that the Si film does not melt substantially but annealing be effective. Concretely, a XeCl excimer laser of the wavelength 308 nm, for example, is used as the light source of the pulse laser beams 25 during the laser annealing. When the Si film is 30 nm thick, irradiation energy density of the pulse laser beam 25 is set to 200 $mJ/cm^2$, pulse width to 30 ns, and number of irradiation pulses to 500 pulses, for the laser annealing.

Figure 13:
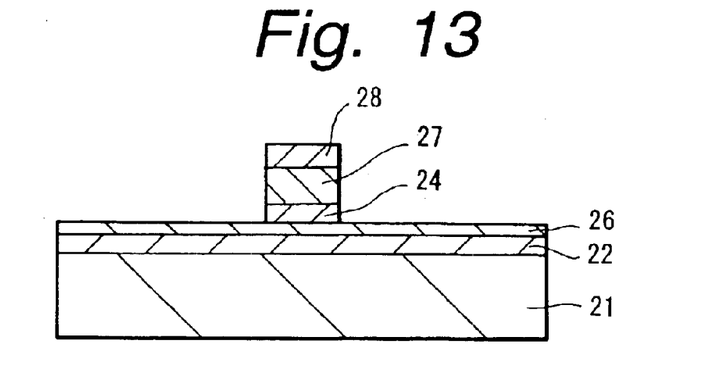
FIG. 13 is a cross-sectional view for explaining the thin-film transistor manufacturing method according to the third embodiment of the invention.

Next as shown in FIG. 13, after a gate electrode 27 in form of a conductive film such as Al film is formed on the entire surface of the gate insulating film 24, a resist pattern 28 of a predetermined configuration is formed on the gate electrode 27. After that, using the resist pattern 28 as a mask, the gate electrode 27 and the gate insulating film 24 are sequentially patterned into predetermined configurations by etching.

Figure 14:
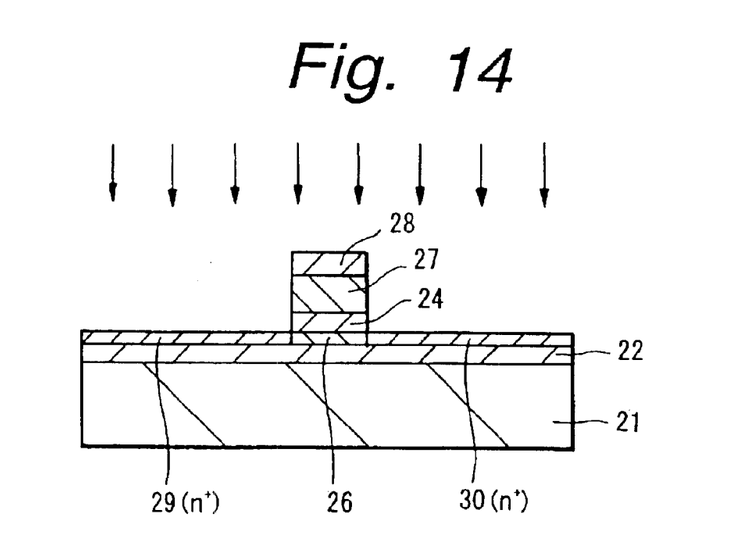
FIG. 14 is a cross-sectional view for explaining the thin-film transistor manufacturing method according to the third embodiment of the invention.

Thereafter, as shown in FIG. 14, while keeping the resist pattern 28, using these resist pattern 28, gate electrode 27 and gate insulating film 24 as a mask, an n-type impurity, such as P, is selectively doped into the polycrystalline Si film 26 by plasma doping, for example. As a result, $n^+$-type source region 29 and drain region 30 are formed in the polycrystalline Si film 26 in self alignment with the gate electrode 27. Thereafter, the resist pattern 28 is removed.

Figure 15:
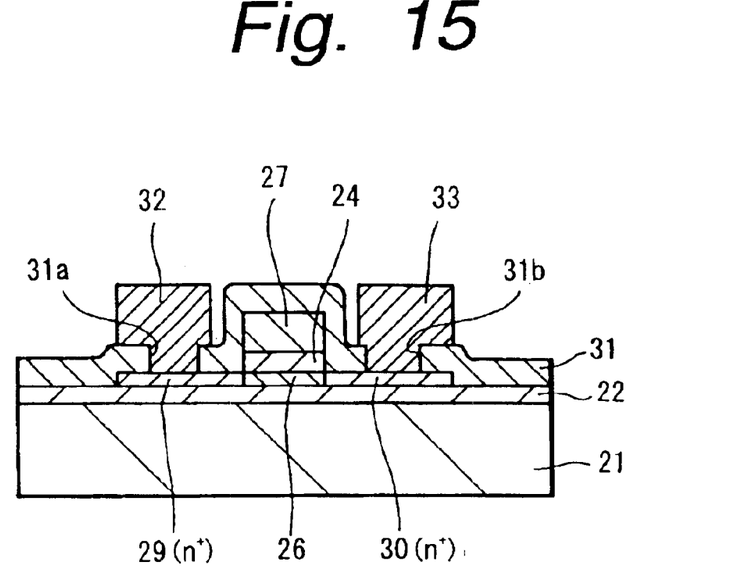
FIG. 15 is a cross-sectional view for explaining the thin-film transistor manufacturing method according to the third embodiment of the invention.

Next as shown in FIG. 15, the polycrystalline Si film 26 is patterned into a predetermined configuration by etching to isolate each location for each thin-film transistor. Then, an insulating film 31 such as $SiO_2$ film is formed on the entire surface by CVD, for example, and the insulating film 31 is selectively removed by etching to make apertures 31a and 31b. Subsequently, an Al film, for example is formed on the entire surface by sputtering, for example, and it is patterned into a predetermined configuration to make electrodes 32 and 33.

Figure 16:
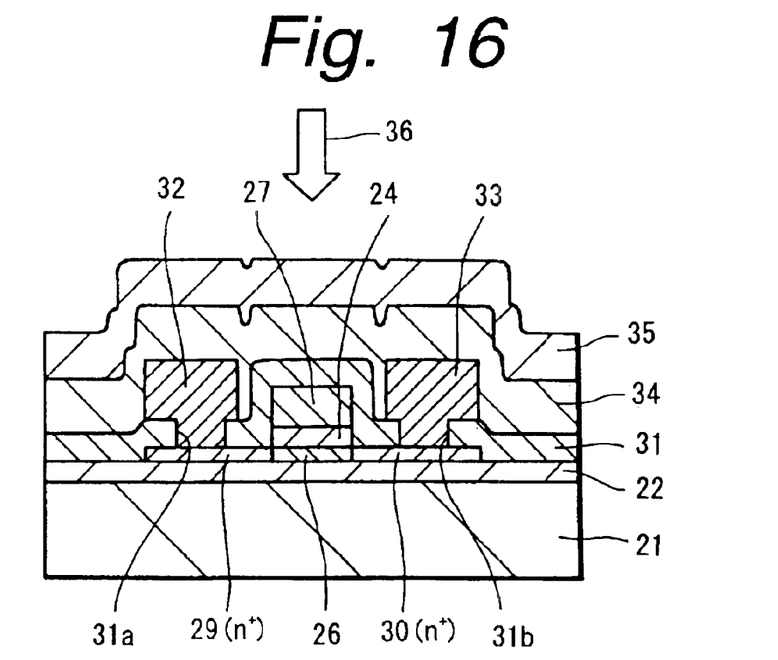
FIG. 16 is a cross-sectional view for explaining the thin-film transistor manufacturing method according to the third embodiment of the invention.

Next as shown in FIG. 16, a silicon nitride ($SiN_x$) film 34, approximately 100 nm thick, for example, and an amorphous Si film 35, approximately 30 nm thick, for example, are sequentially formed on the entire surface by low-temperature plasma CVD, for example. The $SiN_x$ film 34 contains hydrogen therein and becomes a hydrogen supply source during hydrogenation of the polycrystalline Si film 26 explained later. In an example of conditions for making the $SiN_x$ film 34 and the amorphous Si film 35, for making the $SiN_x$ film 34, a mixed gas of $SiH_4$, $NH_3$ and $N_2$ is used as the process gas, flow rate of $SiH_4$ gas is 10 sccm, flow rate of $NH_3$ gas is 40 sccm, flow rate of $N_2$ gas is 135 sccm, pressure is 100 mtorr, plasma power is 40 W, and the substrate temperature is 100° C. For making the amorphous Si film 35, a mixed gas of $SiH_4$ and $H_2$ is used as the process gas, flow rate of $SiH_4$ gas is 20 sccm, flow rate of $H_2$ gas is 80 sccm, pressure is 100 mTorr, plasma power is 10 W, and the substrate temperature is 100° C.

After that, pulse laser beams 36 are irradiated to the substrate, for example, from the side of the amorphous Si film 35. In this case, the pulse laser beams 36 are absorbed by the amorphous si film 35, and the underlying $SiN_x$ film 34 is heated by the heated amorphous Si film 3. As a result, hydrogen is diffused from the $SiN_x$ film 34 into the polycrystalline Si film 26 to hydrogenate it, and dangling bonds along crystal grain boundaries in the polycrystalline Si film 26 are inactivated to decrease the trap density. Simultaneously, the electrodes 32 and 33 connected to the source region 29 and the drain region 30 are sintered and improved in ohmic characteristics.

In this case, irradiation energy density, pulse width, and number of irradiation pulses of the pulse laser beams 36 are chosen to values ensuring the polycrystalline Si film 26 does not melt substantially and the $SiN_x$ film 34 be heated effectively, for example. Additionally, irradiation energy density of the pulse laser beams 36 is chosen to be lower than the irradiation energy density of the pulse laser beams 25 used for making the polycrystalline Si film 26 by crystallizing the amorphous Si film 23 as explained above. In this case, for example, a XeCl excimer laser of the wavelength 308 nm is used as the light source of the pulse laser beams 36. Irradiation energy density, pulse width, and number of irradiation pulses of the pulse laser beams 36 are chosen similarly to those for hydrogenation of the polycrystalline Si film 11 in the first embodiment, for example. Also in the third embodiment, if the pulse laser beam 36 are infrared light, the electrodes 32, 33, plastic substrate 21, and so forth, below the $SiN_x$ film 35 are heated, and their temperatures will increase. Therefore, those with relatively shorter wavelengths are appropriate as the pulse laser beams 36.

Through the steps explained above, the top-gate type thin-film transistor including the polycrystalline Si film as its active region is completed. All of the above-explained processes in the third embodiment are executed at temperatures not higher than the heat-resistant temperature of the plastic substrate 21.

According to the third embodiment, the same effects as those of the first embodiment can be obtained when manufacturing top-gate type thin-film transistors. Additionally, in case of the third embodiment, since the pulse laser beams 35 are absorbed by the amorphous Si film 34, the layers under the amorphous Si film 34 are protected from irradiation of the pulse laser beams 35.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, materials, structures and processes introduced in explanation of the embodiments are not but examples, and any other appropriate numerical value, materials, structures and processes may be used. For example, in the first to third embodiments, a plastic substrate of polyethylene terephthalate (PET) having a heat-resistant temperature around 100° C., for example, may be used in lieu of the plastic substrate 1 or 21 of polyether sulfone, or alternatively, a plastic substrate of polymethyl methacrylate (PMMA) or a plastic substrate of polycarbonate (PC) may be used as well. Furthermore, in the first to third embodiments, a glass substrate, for example, may be used instead of these plastic substrates. Additionally, the amorphous film used as the Si film 5 in the first and second embodiments may be replaced by a polycrystalline film. Moreover, although the use of an amorphous film is preferable as the Si film 23 in the third embodiment, a polycrystalline film is also usable where appropriate.

In the first to three embodiments, a XeCl excimer laser (wavelength 308 nm) is used as the light source of the pulse laser beams 15, 36: however, a KrF excimer laser (wavelength 248 nm), ArF excimer laser (wavelength 193 nm), or the like, may be used as the light source of the pulse laser beams 15, 36. In lieu of the pulse laser beams 15, 36, it is possible to irradiate electron beams or ion beams.

The first to third embodiments have been explained as hydrogenating the polycrystalline Si film, taking examples of manufacturing a thin-film transistor whose active region is made of the polycrystalline Si film; however, the invention is similarly applicable also to cases where an amorphous Si film is hydrogenated. Furthermore, the invention is applicable also for the purpose of reducing boundary defects of a single-crystal device.

As described above, according to the invention, since the semiconductor film can be hydrogenated by irradiating the pulse energy beams, thereby heating the hydrogen-containing film, thereby diffusing hydrogen in the hydrogen-containing film into the semiconductor film and thereby selectively heating the hydrogen-containing film, A semiconductor device manufacturing method can be provided, which can hydrogenate the semiconductor film without damaging the substrate even when the substrate is a low heat-resistant substrate like a plastic substrate. Especially when the semiconductor device to be manufactured is a thin-film transistor using the semiconductor film as its active region, the trap density of the semiconductor film forming the active region can be reduced effectively, and a thin-film transistor with good characteristics can be manufactured.

What is claimed is:

1. A semiconductor device manufacturing method comprising:

forming a semiconductor film on a substrate; forming hydrogen-containing film on said semiconductor film by at least one of a plasma-enhanced chemical vapor deposition and physical vapor deposition; and irradiating a pulse energy beam to heat said hydrogen-containing film and thereby diffuse hydrogen in said hydrogen-containing film into said semiconductor layer;

further comprising irradiating another pulse energy beam to crystallize or re-crystallize said semiconductor film after the step of forming said semiconductor film on said substrate and before the step of forming said hydrogen-containing film on said semiconductor film, an energy density of said pulse energy beam used for heating said hydrogen-containing film being set lower than an energy density of said another pulse energy beam being used to crystallize or re-crystallize said semiconductor film.

2. The semiconductor device manufacturing method according to claim 1 wherein said pulse energy beam is a laser beam, an electron beam or an ion beam.

3. The semiconductor device manufacturing method according to claim 1 wherein said substrate Is a plastic substrate selected from the group consisting of polyether sulfone, polyethylene terephthalate, polymethyl methacrylate and polycarbonate.

4. The semiconductor device manufacturing method according to claim 1 wherein said semiconductor film is a polycrystalline silicon film, amorphous silicon film or single-crystal silicon film.

5. The semiconductor device manufacturing method according to claim 1 wherein said hydrogen-containing film is a silicon nitride film containing hydrogen, an amorphous silicon film containing hydrogen, or a multi-layered film of these films.

6. The semiconductor device manufacturing method according to claim 1 further comprising the step of forming a film for absorbing said pulse energy beam on said hydrogen-containing film after the step of forming said hydrogen-containing on said semiconductor film and after the step of irradiating said pulse energy beam to heat said hydrogen-containing film, said hydrogen-containing film being heated by irradiating said pulse energy beam and thereby heating said film for absorbing said pulse energy beam.

7. The semiconductor device manufacturing method according to claim 6 wherein said film for absorbing said pulse energy beam is a metal film selected from the group consisting of molybdenum, tantalum and tungsten.

8. The semiconductor device manufacturing method according to claim 6 wherein said film for absorbing said pulse energy beam is a semiconductor film made of silicon.

9. The semiconductor device manufacturing method according to claim 1 wherein said semiconductor device is a thin-film transistor using said semiconductor film as an active region thereof.

10. The semiconductor device manufacturing method of claim 1 wherein energy density, number of pulses and pulse width of said pulse energy beam are determined not to melt said semiconductor film.

* * * * *